US006285097B1

(12) United States Patent
Hazelton et al.

(10) Patent No.: US 6,285,097 B1
(45) Date of Patent: *Sep. 4, 2001

(54) PLANAR ELECTRIC MOTOR AND POSITIONING DEVICE HAVING TRANSVERSE MAGNETS

(75) Inventors: Andrew J. Hazelton, San Carlos; Jean-Marc Gery, Beverly Hills, both of CA (US)

(73) Assignee: Nikon Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/309,721

(22) Filed: May 11, 1999

(51) Int. Cl.[7] .............................. B65G 49/07; H01L 21/00
(52) U.S. Cl. .............................................. 310/12; 414/935
(58) Field of Search .................... 310/12, 13, 14; 318/135, 687; 29/721, 760, 785; 33/1 M; 74/471 XY; 108/137, 138; 414/935

(56) References Cited

U.S. PATENT DOCUMENTS

| 4,535,278 | * | 8/1985 | Asakawa | 318/687 |
| 4,654,571 | * | 3/1987 | Hinds | 318/687 |
| 5,723,929 | * | 3/1998 | Niimi | 310/154 |

\* cited by examiner

*Primary Examiner*—Nicholas Ponomarenko
*Assistant Examiner*—Judson H. Jones
(74) *Attorney, Agent, or Firm*—Morrison & Foerster LLP

(57) ABSTRACT

A magnet array having a plurality of alternating polarity (N and S) magnets as well as transverse magnets disposed in a plane is disclosed. The N and S magnets have opposing polarities and are arranged in a checkerboard pattern in the magnet array. The transverse magnets are disposed between immediate adjacent N and S magnets. The transverse magnets facilitate the forming of a continuous magnetic flux path through the transverse magnet and immediate adjacent N and S magnets. The magnet array of the present invention may be utilized in an electric motor or a positioning device comprising a coil array positioned adjacent to a magnet array where the coil array is operable to interact with the magnetic fields of the magnet array to provide a force therebetween. The magnet array may also be utilized in an exposure apparatus such as a photolithography system to position and support a wafer for photolithography processing in the manufacturing of semiconductor devices.

42 Claims, 8 Drawing Sheets

PLANAR ELECTRIC MOTOR AND POSITIONING DEVICE HAVING TRANSVERSE MAGNETS

FIELD OF THE INVENTION

This invention relates generally to electric motors and more particularly to high precision electric motors having transverse magnets for use in lithography systems.

BACKGROUND OF THE INVENTION

Electric motors are used in a variety of electrical equipment. For example, wafer stages also utilize linear or planar electric motors to position a wafer during photolithography and other semiconductor processing.

A typical one-dimensional linear electric motor has a magnet track with pairs of opposing magnets facing each other. An armature is disposed in a space defined between the pairs of opposing magnets. The space extends along a direction along which the armature may move. The armature has windings of a conductor which, upon application of an electrical current, the electric current interacts with the magnetic fields of the magnet pairs to exert force on the armature, causing the armature to move. The armature moves along the length of the space. When the armature is attached to a wafer stage, the wafer stage experiences the same force as and moves in concert with the armature.

Two-dimensional planar electric motors are utilized in semiconductor manufacturing. For example, U.S. Pat. No. 4,654,571, entitled "Single Plane Orthogonally Moveable Drive System," to Hinds and U.S. Pat. No. 4,535,278, entitled "Two-Dimensional Precise Positioning Device for Use in a Semiconductor Manufacturing Apparatus," to Asakawa discuss two-dimensional electric motors and are incorporated herein by reference in their entireties. The two-dimensional motors have two-dimensional arrays of magnets and an armature or an array of coils movable relative to each other in two or more directions rather than magnet tracks having a space along which an armature moves along a single direction. The magnet array and the armature may move relative to each other in more than two dimensions depending upon the design. Conventional two-dimensional motors typically have an array of magnets and an armature having one or more coils disposed on one side of the array of magnets.

U.S. Pat. No. 5,623,853, entitled "Precision Motion Stage with Single Guide Beam and Follower Stage," to Novak et al. and U.S. Pat. No. 5,528,118, entitled "Guideless Stage With Isolated Reaction Stage," to Lee discuss examples of semiconductor fabrication equipment and are incorporated herein by reference in their entireties.

A platform may be attached to a two-dimensional motor and the platform can be moved in two or more dimensions by the motor. For example, a wafer stage in semiconductor processing equipment may be attached to an armature or a magnet array of a two-dimensional electric motor and the two-dimensional motor would control positioning of the wafer stage.

One problem with conventional magnet arrays is their relatively low magnetic flux to mass ratio. Without a backing by a magnetically permeable material, the magnetic flux is relatively low. A magnetically permeable backing facilitates the completion of magnetic flux paths between magnets having opposite polarities. The magnetic flux of the magnet array is greater when the flux paths are completed by the magnetically permeable backing. However, magnetically permeable backing, such as iron, are relatively heavy and decreases the magnetic flux to mass ratio of the magnet array. If the flux paths between the magnets of opposite polarities could still be completed without the use of a heavy magnetically permeable backing, the magnetic flux to mass ratio would be improved. For electric motors having a moving magnet array and a stationary coil array rather than a moving coil array and a stationary magnet array, this reduction in mass would improve the efficiency of the electric motor.

There is, therefore, a need for a compact motor which provides high speed and precision and energy efficient operation.

SUMMARY OF THE INVENTION

The present invention comprises a magnet array having a plurality of N and S magnets and transverse magnets disposed in a plane. The N and S magnets have opposing polarities substantially perpendicular to the plane and the transverse magnets have a polarity substantially parallel to the plane. The N and S magnets of the magnet array are arranged in a checkerboard pattern in the plane and the transverse magnets are disposed between immediate adjacent N and S magnets. The transverse magnets facilitate the forming of a continuous magnetic flux path through the transverse magnet and immediate adjacent N and S magnets.

The N and S magnets are periodically and alternately arranged along two orthogonal directions in the plane. In one embodiment, the N and S magnets are alternately disposed along two orthogonal edges of the magnet array. In another embodiment, the N and S magnets are alternately disposed along a diagonal of the array.

The magnet array preferably includes corner magnets at the corners of the array, non-corner edge magnets disposed along the edges of the array as well as interior magnets disposed interior of the corner and edge magnets. The interior magnets comprise N, S and transverse magnets. The edge magnets may comprise only N magnets, only S magnets or N, S and transverse magnets. The corner magnets comprises either N or S magnets. In one embodiment, the N and S edge magnets are alternately arranged in a periodic manner along the edges and corners of the magnet array and transverse edge magnets are disposed between immediate adjacent N and S edge magnets.

Each of the N and S interior magnets may have approximately equal magnetic flux. Each transverse interior magnet preferably has a magnetic flux less than the magnetic flux of the interior N and S magnets. For example, the magnetic flux of each transverse magnet may be approximately one-half of the magnetic flux of the interior N and S magnets.

Each edge magnet has a magnetic flux less than the magnetic flux of a corresponding N, S or transverse interior magnet. For example, an S edge magnet has less magnetic flux than an S interior magnet or a transverse edge magnet has less magnetic flux than a transverse interior magnet. In addition, each corner magnet has a magnetic flux less than the magnetic flux of a corresponding N or S interior magnet. In one embodiment, each edge magnet has approximately one-half the magnetic flux of the corresponding interior magnet and each corner magnet has one-quarter the magnetic flux of the corresponding interior magnet.

In another embodiment of the magnet array of the present invention, each N and S magnet may comprise two or more component magnets each having a polarity at an angle relative to the resultant N or S polarities. However, this increases the manufacturing complexity and thus increases the cost of the magnet array.

The magnet array of the present invention may be utilized in an electric motor or a positioning device comprising a coil array positioned adjacent to a magnet array. The coil array is operable by suitable application of current to interact with the magnetic fields of the magnet array to provide a force between the coil array and the magnet array. The force between the coil array and the magnet array causes the coil array and the magnet array to move relative to each other.

The magnet array may also be utilized in an exposure apparatus such as a photolithography system. The exposure apparatus comprises an optical system for imaging a pattern onto an article, and a stage device for positioning the article relative to the optical system. The stage device may include an electric motor and a stage movable relative to the optical system and having a surface for supporting the article. As described above, an electric motor comprises a magnet array and a coil array. Either the magnet array or the coil array is stationary and attached to a frame of the optical system and the other of the magnet array and the coil array is attached to a surface of the stage for positioning of the article.

The invention's electric motors and positioning devices are useful in environments requiring precise and wide ranges of positioning. In particular, the invention is particularly useful in positioning wafers during semiconductor manufacture.

These and other objects, features, and advantages of the invention will become readily apparent to those skilled in the art upon a study of the following drawings and a reading of the description of the invention below.

DESCRIPTION OF THE INVENTION

Figure 1:
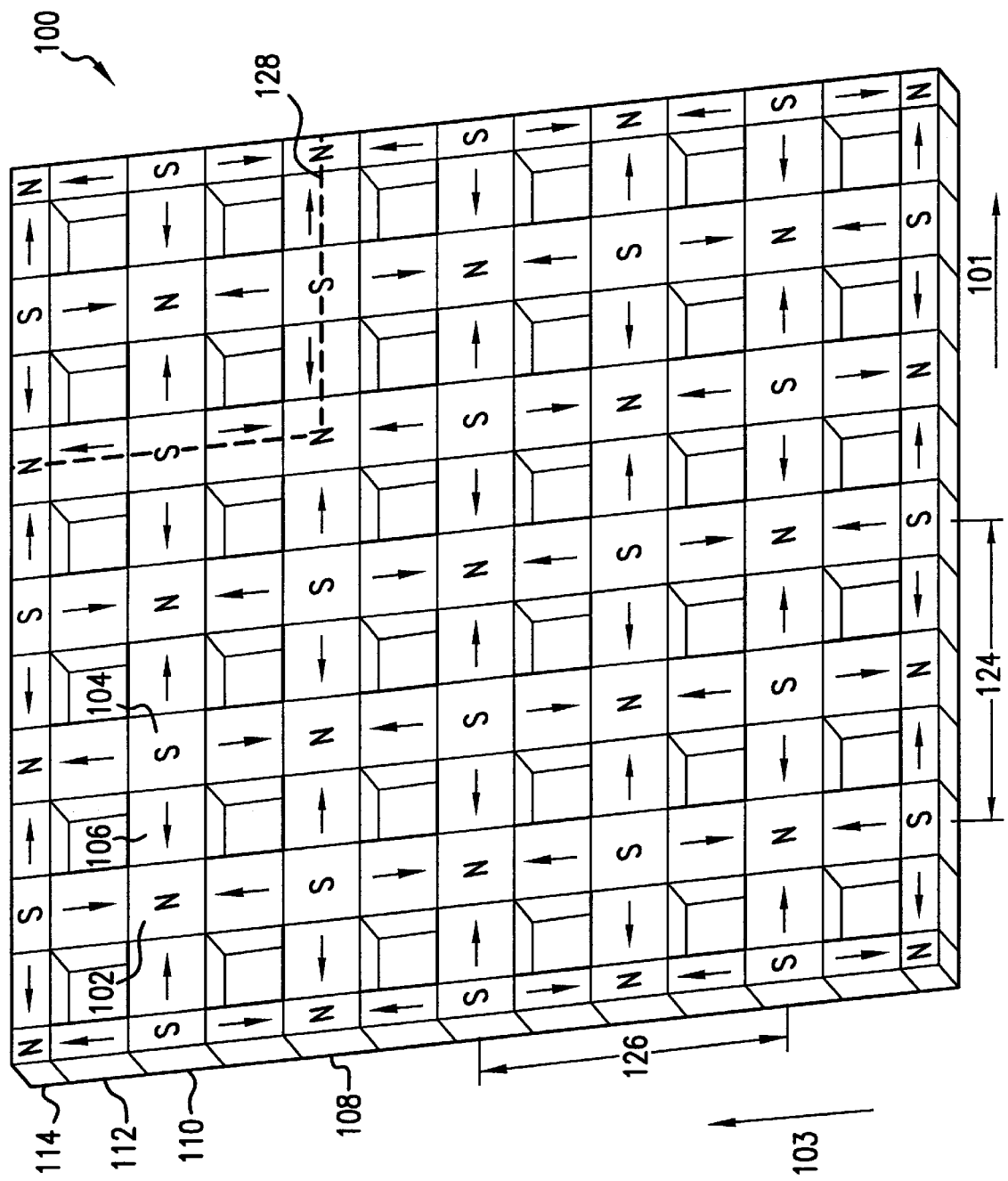
FIG. 1 is a perspective view of a magnet array of the present invention.
Figure 2:
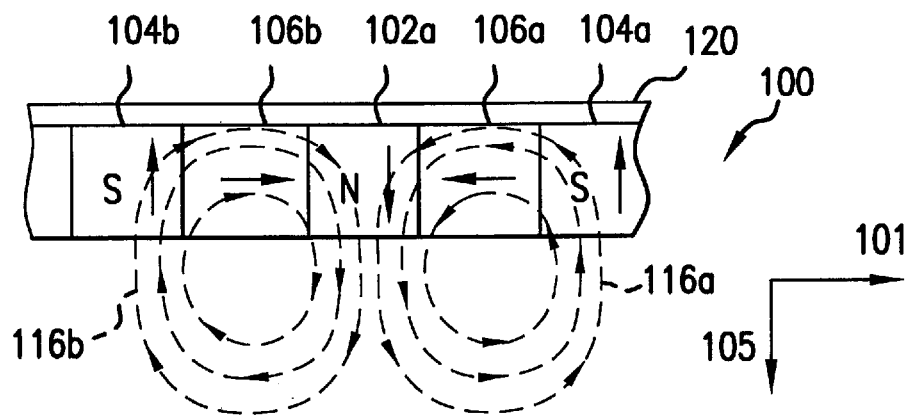
FIG. 2 is a partial side view of the magnet array of FIG. 1.

FIGS. 1 and 2 are a perspective and a partial side view of a magnet array 100 according to a preferred embodiment of the present invention. The magnet array 100 has a plurality of magnets disposed along a first direction 101 and a second direction 103 to form a two-dimensional magnet array.

Magnet array 100 comprises a checkerboard array of N and S magnets 102, 104 and transverse magnets 106 separating N and S magnets in the first and second directions 101, 103. N and S magnets 102, 104 are oriented such that they have magnetic polarities parallel to third direction 105 (shown in FIG. 2) perpendicular to the first and second directions 101, 103. The polarity of the N magnets 102 generally extend along the third direction 105 (out of the page of FIG. 1) and the polarity of the S magnets 104 generally extend opposite the third direction 105 (into the page of FIG. 1). Accordingly, N and S magnets 102, 104 alternate in polarity or have opposite polarities.

Transverse magnets 106 have polarities generally parallel to the plane defined by first and second directions 101, 103. As shown by the arrows indicated on the transverse magnets 106 in FIG. 1, transverse magnets 106 are oriented such that they have magnetic polarities in a direction generally extending from an S magnet 104 to an N magnet 102. Transverse magnets 106 may be along the first direction, opposite the first direction, along the second direction or opposite the second direction. Transverse magnets 106 facilitate the completion of the magnetic flux paths between N and S magnets 102, 104, as will be described in more detail below.

Interior N and S magnets 102, 104 are disposed interior to a perimeter of the magnet array 100. Each of interior N and S magnets 102, 104 preferably has approximately equal magnetic fluxes. Each interior transverse magnet 106 preferably has approximately equal magnetic fluxes which are preferably the same or less than the magnetic flux of each of the N and S magnets 102, 104. It is possible although not preferred to provide transverse magnets having magnetic fluxes greater than those of the N and S magnets.

The perimeter of the magnet array 100 comprises exterior magnets which are generally fractional portions of the interior N, S and transverse magnets 102, 104, 106. In the embodiment shown in FIGS. 1 and 2, the perimeter or the exterior magnets of magnet array 100 include edge N magnets 108, edge S magnets 110, edge transverse magnets 112, and corner N magnets 114. Providing exterior magnets as fractional portions of the corresponding interior magnets provides not only fractional portions of the physical size but also fractional portions of the magnetic flux of the corresponding interior magnets. For example, each edge magnet preferably has approximately one-half of the magnetic flux of the corresponding interior magnet. Further, each corner magnet preferably has approximately one-quarter of the magnetic flux of the corresponding interior magnet.

In the embodiment shown in FIGS. 1 and 2, edge N magnet 108 has approximately one-half the magnetic flux of the interior N magnet 102 and edge S magnet 110 has approximately one half the magnetic flux of the interior S magnet 104. In addition, corner N magnet 114 has approximately one-quarter the magnetic flux of the interior N magnet 102. Other combinations, sizes, shapes, and magnetic fluxes of N and S magnets and transverse magnets for the interior, edge or corner may be utilized, as is evident to one of ordinary skill to the art. For example, in the embodiment shown in FIGS. 1 and 2, all N magnets may be replaced with S magnets and vice versa and all transverse magnets may be rotated 180° such that corner S magnets, rather than corner N magnets are provided.

The magnetic polarity of the N and S magnets of the magnet array 100 is periodic in both directions 101 and 103.

Magnet array 100 has a magnetic period 124 in the direction 101 and a magnetic period 126 in the direction 103. The magnetic periods 124 and 126 may, but need not, be equal. Both magnetic periods 124 and 126 are twice the structural period displayed in the magnet array 100. The dimensions of the transverse magnets 106 in directions 101 and 103 are dependent upon the periods 124 and 126 and the corresponding dimension of the N and S magnets 102, 104.

In the embodiment shown in FIGS. 1 and 2, the N and S magnets are disposed in magnet array 100 such that the polarity is the same along a diagonal, i.e. 45° relative to directions 101 and 103. In addition, magnet array 100 alternates in polarity between the N and S magnets in direction 101 as well as in direction 103. Alternative magnet arrays may provide a same polarity in each row with the rows alternating in polarity. Such alternative embodiments are described below.

Magnet array 100 essentially comprises a plurality of symmetry blocks 128 as designate by dashed lines. Each symmetry block has a length of magnet period 124 along direction 101 and a width of magnet period 126 along direction 103. In other words, magnet array 100 is merely the result of juxtaposing a suitable number of symmetry blocks 128 to form an array of a desired size.

Referring now to the partial side view of magnet array 100 of FIG. 2, the magnetic flux paths and benefits of providing transverse magnets 106 will be described in more detail. As described above, transverse magnets 106 are disposed between N and S magnets along the first and second directions 101, 103 and facilitate the completion of the magnetic flux paths between N and S magnets 102, 104. For example, transverse magnet 106a facilitates the completion of flux paths 116a between N and S magnets 102a and 104a. Similarly, transverse magnet 106b facilitates the completion of flux paths 116b between N and S magnets 102a and 104b.

Magnet array 100 may include a backing 120. The backing 120 provides structural support to the magnets of the magnet array 120 and a surface to which the magnets may be attached. The magnets of the magnet array 100 may be bonded to a surface of the backing 120 by, for example, an adhesive such as epoxy.

The backing 120 preferably comprises a magnetically non-permeable material. A magnetically non-permeable backing prevents the creation of a leakage magnetic flux path between the N and S magnets and thereby further facilitate the completion of the magnetic flux path between the N and S magnets through the transverse magnets. Alternatively, backing 120 may comprise a magnetically permeable material such that the magnetic flux may also flow through the backing 120.

Figure 3:
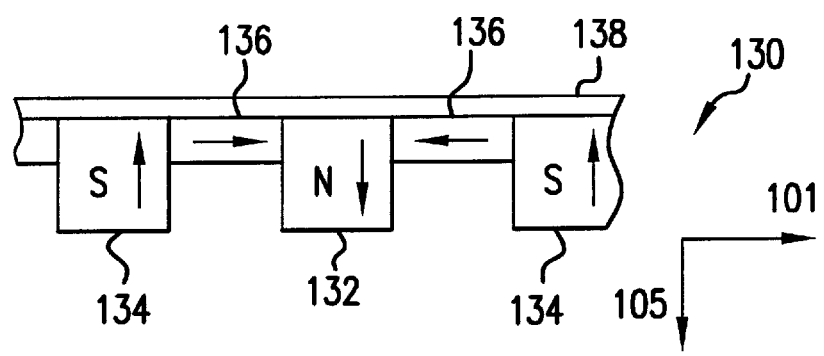
FIG. 3 is a partial side view of a variation of the magnet array of FIGS. 1 and 2 having fractional transverse magnets.

FIG. 3 shows a partial side view of another magnet array 130 with a backing. Magnet array 130 has a checkerboard arrangement of N and S magnets and transverse magnets between N and S magnets in an arrangement similar to that of the magnet array shown in FIGS. 1 and 2.

Each interior transverse magnet of magnet array 130 of FIG. 3 has a fraction of the magnet flux as that of the interior N and S magnets. In contrast, in the embodiment shown in FIGS. 1 and 2, each interior transverse magnet is approximately the same size and same magnetic flux as each interior N or S magnet and each edge transverse magnet is approximately the same size and same magnetic flux as each edge N or S magnet.

In addition, in the magnet array 130 of FIG. 3, each edge transverse magnet 136 has a fraction of the magnet flux of that of each interior transverse magnets. For example, each interior transverse magnet may have one-half or one-third of the magnet flux as that of the interior N and S magnets. In addition, each edge transverse magnets 136 may have one-half of the magnet flux as that of the interior transverse magnets, or one-quarter or one-sixth of the magnet flux of interior N and S magnets. As is evident to one of ordinary skill in the art, the precise fractional portions may be varied and determined according to the operating parameters of the electric motor utilizing the magnet array.

As shown in the side view of FIG. 3, magnet array 130 may also include a backing 138, preferably but not necessarily comprising a magnetically non-permeable material. In addition, the transverse magnets, including the edge transverse magnets 136, are preferably disposed adjacent a surface of backing 138 facing the magnets or, where backing is not provided, adjacent an upper plane defined by the N and S magnets.

Figure 4:
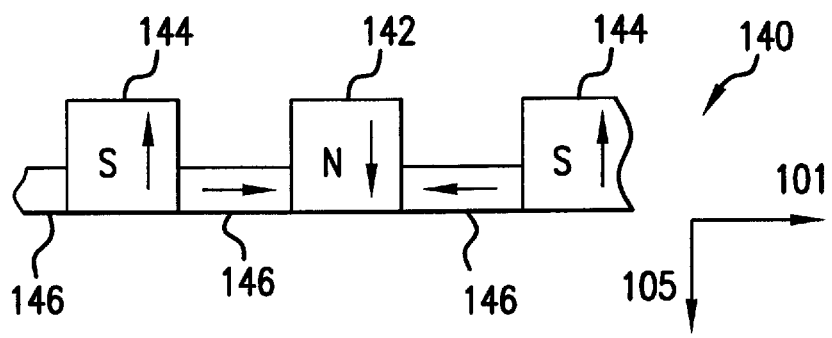
FIG. 4 is a partial side view of another variation of the magnet array of FIG. 1 having fractional transverse magnets.

FIG. 4 shows a partial side view of another magnet array 140 according to the present invention. Magnet array 140 comprises transverse magnets, including edge transverse magnets 146, disposed between N and S magnets, such as N and S edge magnets 142, 144. Magnet array 140 does not include a backing and magnets of the magnet array may be bonded to each other with, for example, an adhesive such as epoxy. However, magnet array 140 may also include a backing preferably but not necessarily comprising a magnetically non-permeable material. The transverse magnets, including the edge transverse magnets 146, are disposed away from an upper plane defined by the N and S magnets, or, if a backing is provided, away from a surface of the backing which faces the magnets. The transverse magnets may be disposed adjacent a lower plane defined by the N and S magnets.

In this embodiment, due to the position of the transverse magnets along the third direction 105, the transverse magnets of magnet array 140 does not facilitate the completion of magnetic fluxes as much as the transverse magnets of magnet arrays shown in FIGS. 1–3. However, one of ordinary skill in the art will understand from these various embodiments that the transverse magnets may be disposed at various locations along the third direction 105 and that the each of the transverse magnets of a magnet array need not be in the same location along the third direction 105.

Figure 5:
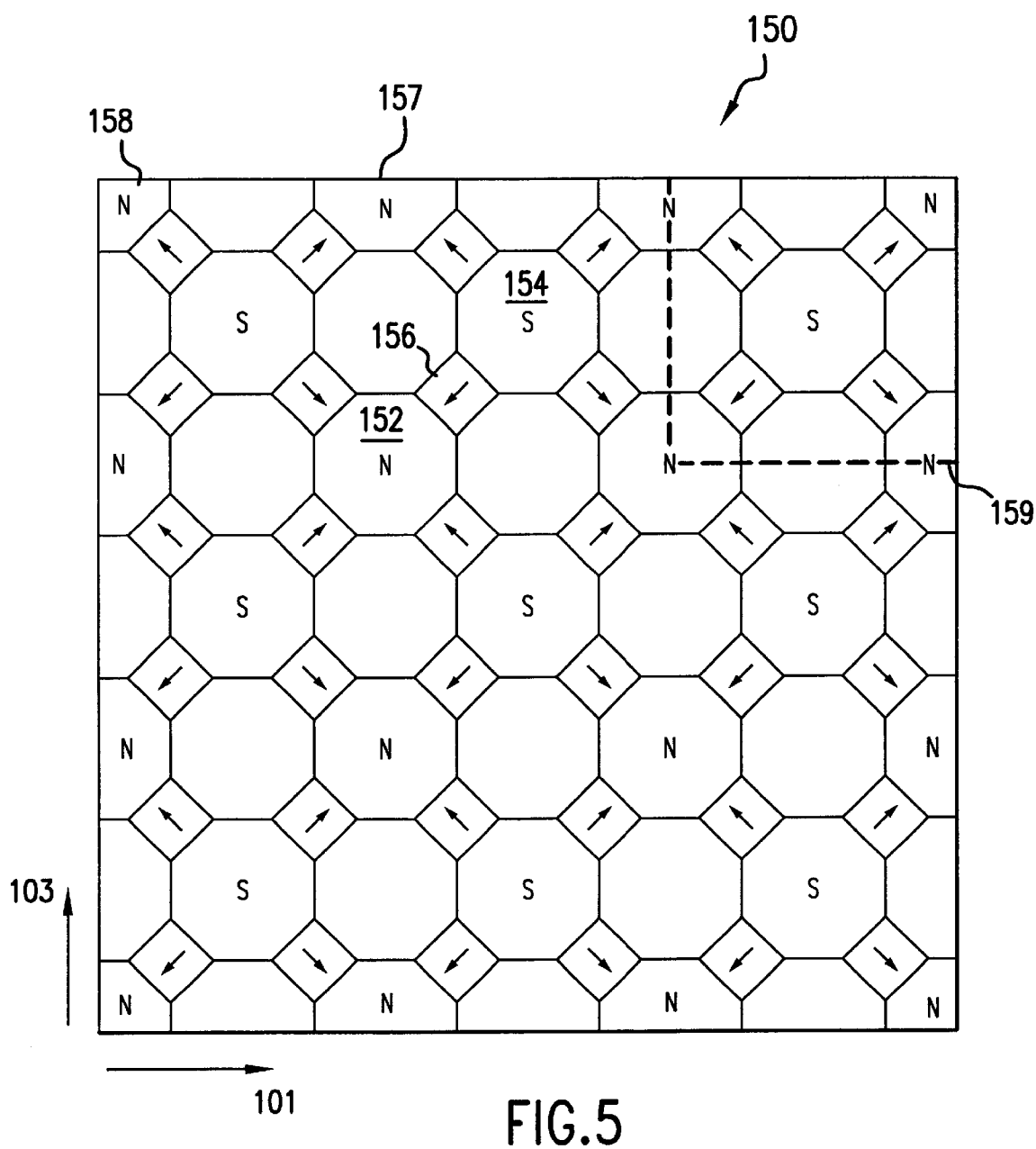
FIG. 5 is a plane view of a yet another variation of a magnet array of the present invention.

FIG. 5 is a plane view of a yet another variation of a magnet array 150 of the present invention similar to an embodiment described in co-pending U.S. patent application Ser. No. 09/135,624 filed on Aug. 17, 1998, entitled "Compact Planar Motor Having Multiple Degrees of Freedom" which is incorporated herein by reference in its entirety. Magnet array 150 comprises N and S magnets where only magnets of the same polarity, i.e. N or S magnets, are disposed in each row along direction 101 and in each column along direction 103. In other words, only magnets of a given polarity are found in a certain row along direction 101 or a certain column along direction 103. Magnet array 150 comprises two rows and two columns of N magnets 152, three rows and three columns of S magnets 154. Thus, magnets of alternating polarities (N and S magnets) are disposed along the diagonals, i.e. at 45° relative to directions 101 and 103.

Magnet array 150 further comprises a plurality of transverse magnets 156 having a magnet flux approximately one-half the magnet flux of each of N and S magnets 152, 154. Those skilled in the art will recognize that the function of these transverse magnets 156 is similar to the transverse magnets described above, namely, to complete the magnetic flux path of the magnets of the magnet array 150. For example, transverse magnet 156 connects the opposite S pole of N magnet 152 with the opposite N pole of S magnet 154, thereby concentrating the magnetic flux from S magnet 154 toward N magnet 152. Because of this internal magnetic circuit completion, the external magnetic flux from N magnet 152 toward S magnet 154 becomes stronger. The internal magnetic circuit completion thus effects a more efficient operation of an electric motor utilizing such a magnet array.

Magnet array 150 also comprises fractional N magnets along the perimeter. These fractional N magnets include edge N magnets 157 and corner N magnets 158. Each edge N magnet 157 is preferably approximately one-half the size and magnetic flux of each interior N magnet 152 and each corner N magnet 158 is preferably approximately one-quarter the size and magnetic flux of each interior N magnet 152.

Similar to magnet array 100, magnet array 150 essentially comprises a plurality of symmetry blocks 159 as designated by dashed lines. Each symmetry block has a length and width equal to the period of interior magnet N 152 along directions 101 and 103, respectively. In other words, magnet array 100 is merely the result of juxtaposing a suitable number of symmetry blocks 128 to form an array of a desired size.

Although magnet array 150 is arranged in a checkerboard arrangement of N and S magnets, such an arrangement is different from the arrangement of magnet array 100. Magnet array 100 comprises magnets of alternating polarities, i.e. N and S magnets, in each row along direction (the first direction) 101 and in each column along direction (the second direction) 103, rather than along the diagonals. In addition, magnet array 100 comprises magnets of the same polarity along the diagonals, rather than along the rows and columns. Further, the size of each transverse magnet 156 relative to the N and S magnets 152, 154 is smaller in magnet array 150 than in magnet array 100. In addition, magnet array 150 is similar to the magnet array 100 rotated 45° about the direction perpendicular to directions 101 and 103.

Despite the differences, the same principles of using N and S magnets, transverse magnets and the completion of the magnetic fluxes which apply to magnet array 100, as described above, apply to magnet array 150. The magnet array 150 is also appropriate for use in a two-dimensional electric motor.

Figure 6A:
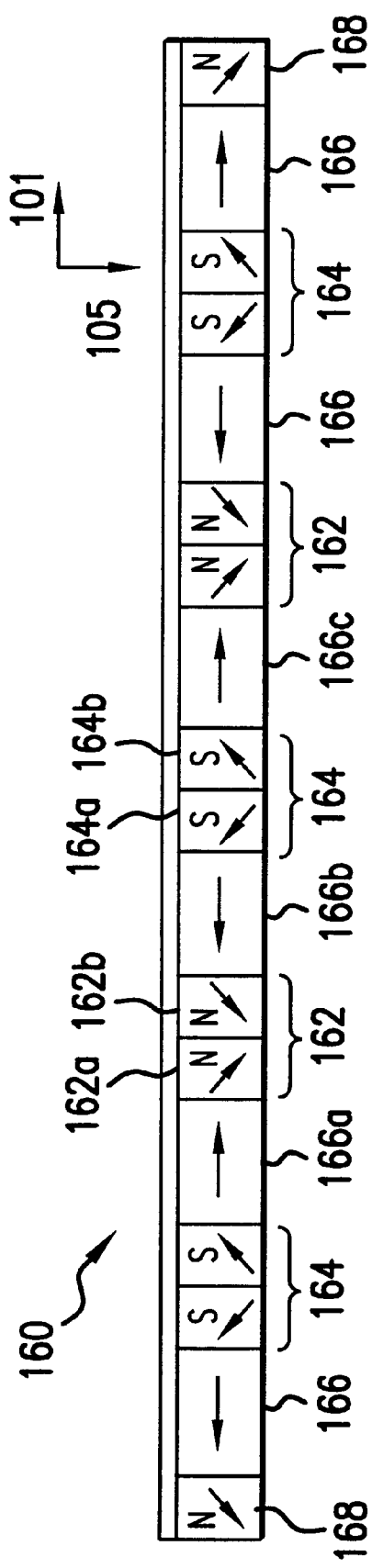
FIG. 6A is a side view of a variation of a magnet array of the present invention.
Figure 6B:
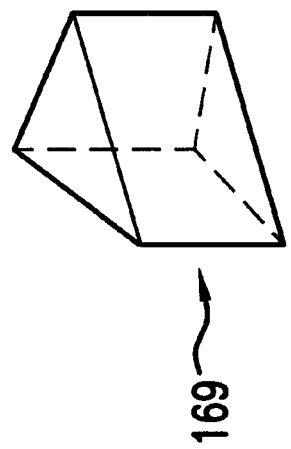
FIG. 6B is a perspective view of a component magnet of FIG. 6A.

FIG. 6A shows a side view of another magnet array 160 according to the present invention. Magnet array 160 is similar to the magnet array 100 shown in FIGS. 1 and 2 but utilizes two or more magnets for each resultant N magnet 162 and each resultant S magnet 164. For example, resultant edge N magnet 162 comprises two N component magnets 162a, 162b having polarities as shown in FIG. 6A and a third interior magnet 169 (shown in FIG. 6B). The polarity of each of the N component magnets 162a, 162b is preferably the vector sum or a weighted vector sum of the polarity of the transverse magnet(s) 166 immediately adjacent to the component magnet and the desired resultant polarity, i.e. a vector parallel to and along third direction 105. However, the provision of component magnets to form N and S magnets increases the complexity of manufacturing and thus the cost of the magnet array.

For example, N component magnet 162a has a polarity which is the vector sum or a weighted vector sum of the polarity of the transverse magnet 166a immediately adjacent to N component magnet 162a and the desired resultant polarity, i.e. a vector parallel to and along third direction 105. Similarly, N component magnet 162b has a polarity which is the vector sum or a weighted vector sum of the polarity of the transverse magnet 166b immediately adjacent to N component magnet 162b and the desired resultant polarity, i.e. a vector parallel to and along third direction 105. The resultant or vector sum of the polarities of the N component magnets 162a, 162b is thus parallel to and along third direction 105.

Each of the resultant S magnets 164 is similar to the resultant N magnet 162. For example, resultant S magnet 164 comprises S component magnets 164a and 164b having polarities as shown in FIG. 6A. The polarity of each of the S component magnets 164a, 164b is preferably the vector sum or a weighted vector sum of the polarity of the transverse magnet 166 immediately adjacent to the component magnet and the desired resultant polarity, i.e. a vector parallel to and opposite the third direction 105.

For example, S component magnet 164a has a polarity which is the vector sum or a weighted vector sum of the polarity of the transverse magnet 166b immediately adjacent to the S component magnet 164a and the desired resultant polarity, i.e. a vector parallel to and opposite the third direction 105. Similarly, S component magnet 164b has a polarity which is the vector sum or a weighted vector sum of the polarity of the transverse magnet 166c immediately adjacent to S component magnet 164b and the desired resultant polarity, i.e. a vector parallel to and opposite the third direction 105. The resultant or vector sum of the polarities of the S component magnets 164a, 164b is thus parallel to and opposite direction 105.

Each component N or S magnet may be of a variety of shapes. For example, each interior N or S magnet (not shown) may comprise four (4) component magnets 169 as shown in the perspective view of FIG. 6B. Component magnet 169 is shown to be a regular 5-sided triangular prism and may be approximately twice the size of each edge component magnets, such as magnets 162a, 162b. Each component edge magnet 162a, 162b, 164a or 164b may have a shape similar to component magnet 169. In addition, each corner magnet 168 may be a right-angled triangular prismatic block. These and other variations of these component magnets, or wedge magnets, are described in co-pending U.S. patent application Ser. No. 09/168,694 filed Oct. 2, 1998, entitled "Wedge and Transverse Magnet Arrays" which is incorporated herein by reference in its entirety. Other shapes may also be utilized such that the polarity of the resultant N or S magnet is symmetrical about a central axis perpendicular to directions 105.

Figure 7:
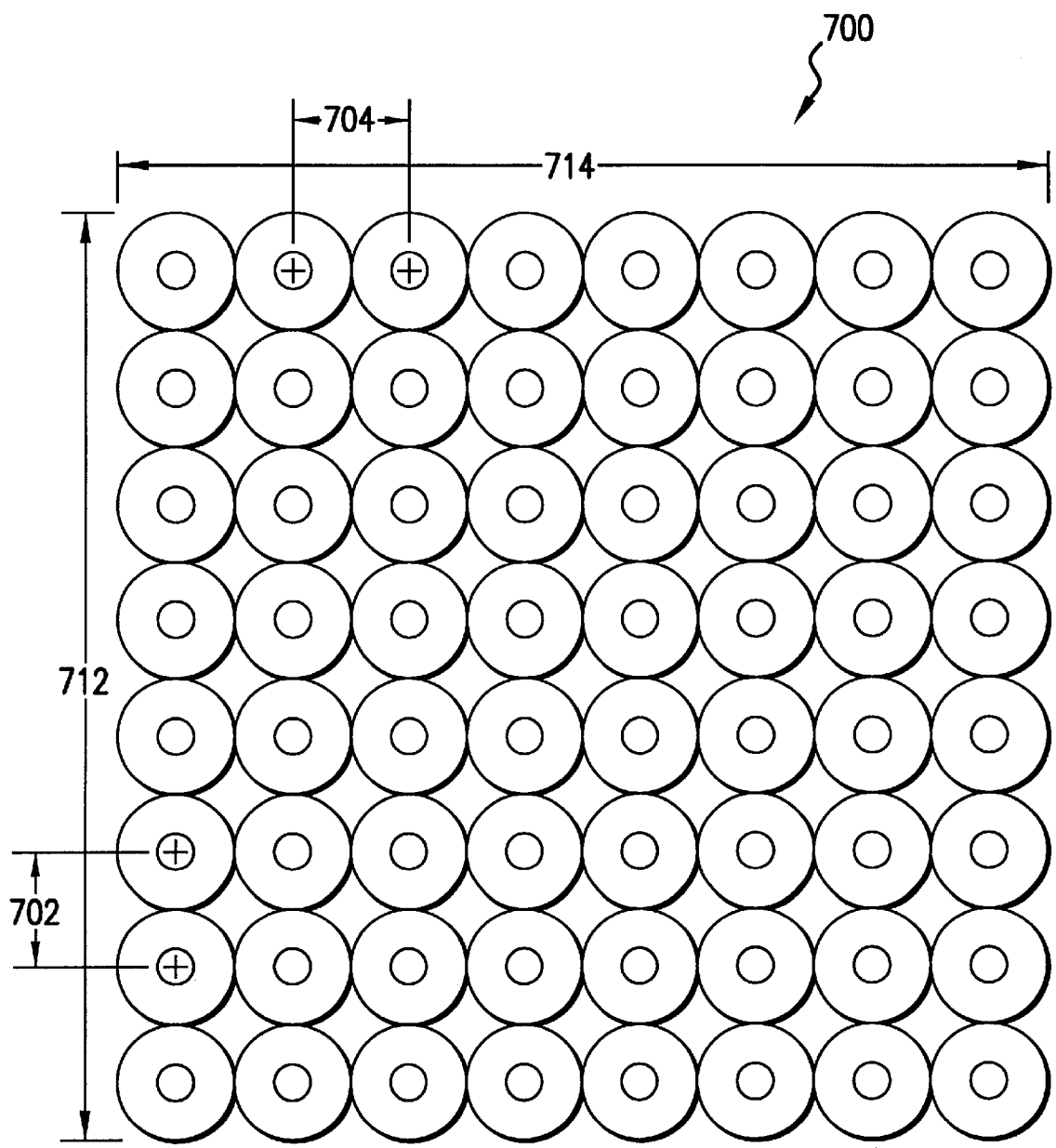
FIG. 7 is a plane view of a coil array for use with a magnet array in a two-dimensional electric planar motor of the present invention.

FIG. 7 is a plane view of a coil array 700 appropriate for use with one or a variant of the magnet array embodiments described above to form an inventive two dimensional electric motor. During operation of the electric motor, the surface of the coil array 700 is in proximity to the face of the magnet array visible, for example, in FIG. 1.

As shown in FIG. 7, the coil array 700 has coils arranged in a rectangular pattern. The coil array 700 has periods 702 and 704 which may or may not be equal. When the periods 702 and 704 are approximately equal and the widths 712 and 714 are approximately equal, the coil array 700 has a "square" period. Each coil in the coil array 700 has approximately the same shape. As shown in FIG. 7, each of the coils may have a toroidal shape. When the periods 702 and 704 are unequal, each coil has a somewhat oval profile. In some embodiments, the coils will have a squared profile in the toroidal shape. Such a squared profile is depicted in the embodiment 700 shown in FIG. 7.

The periods of the magnet array are related to the periods of the coil array. In some embodiments of the invention's electric motor, the coil periods 702 and 704 may be approximately three-fourths of the magnet periods 124 and 126 in the corresponding directions.

Figure 8:
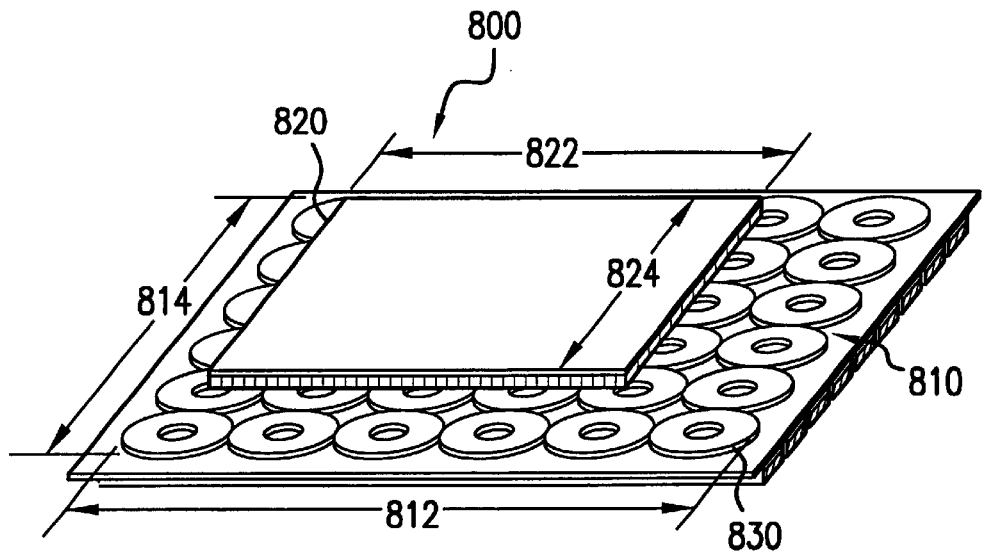
FIG. 8 is a perspective view of a two-dimensional electric planar motor of the present invention.

FIG. 8 is a perspective view of a two-dimensional moving magnet electric planar motor 800 of the present invention utilizing one or a variant of the magnetic array embodiments described above. The electric motor 800 has a coil array 810 and a magnet array 820. Each coil 830 in the coil array 810 has approximately the same shape and a rectangular coil profile is preferred. A coil array width 812 is larger than a magnet array width 822, and a coil array width 814 is larger than a magnet array width 824.

An air bearing (not shown) may be provided in the magnet electric planar motor 800 to separate the coil array 810 from the magnet array 820. When the air bearing separates the coil array 810 and the magnet array 820, the coil array 810 and/or the magnet array 820 may be potted or covered with a flat plate to form essentially flat surfaces. The potting material may be any suitable material, such as epoxy, or covered by a flat plate made of, for example, ceramic, composite, plastic or metal, to form essentially flat surfaces. The essentially flat surfaces improve performance of the air bearing in separating or levitating the coil array 810 and magnet array 820 relative to each other. The air bearing may position the coil array 810 and the magnet array 820 at a neutral position about which the coil array 810 and the magnet array 820 can move relative to each other in three degrees of freedom.

Figure 9:
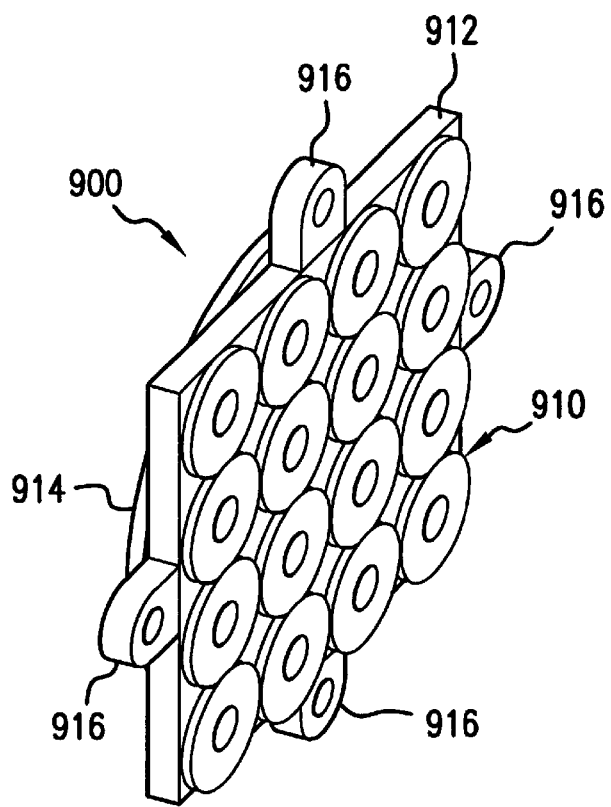
FIG. 9 is a perspective view of an alternative coil array for use with a magnet array in a moving coil planar motor of the present invention.

FIG. 9 is a perspective view of an alternative coil array portion 900 for use with one or a variant of the magnetic array embodiments described above. Coil array portion 900 is intended to be utilized in a moving coil planar motor. Coil array portion 900 includes a coil array 910 which may be attached to a backing 912 which is in turn attached to a platform 914. The backing 912 may comprise a magnetically permeable material, such as iron, or a magnetically impermeable material. A magnetically permeable backing 912 increases the permanent magnetic flux through the coils and thus increases the performance. However, a magnetically permeable backing 912 increases the mass of the coil array 910. Therefore, a greater force must be generated by the moving coil electric motor to move the coil array 910.

In a moving coil embodiment of an electric motor, the coil array portion 900 preferably includes an air bearing 916 to facilitate the separation of the coil array 910 and the magnet array (not shown). Construction and usage of an air bearing are known to those skilled in the art. Hinds (U.S. Pat. No. 4,654,571) referenced above describes an example of an air bearing. When the air bearing separates the coil array 910 and the magnet array, the coil array 910 and/or the magnet array may be potted with any suitable material, such as with epoxy, or covered by a flat plate made of, for example, ceramic, composite or metal, to form essentially flat surfaces. The essentially flat surfaces improve performance of the air bearing 916 in separating or levitating the coil array 910 and magnet array relative to each other. The air bearing 916 may position the coil array 910 and the magnet array at a neutral position about which the coil array 910 and the magnet array can move relative to each other.

Figure 10:
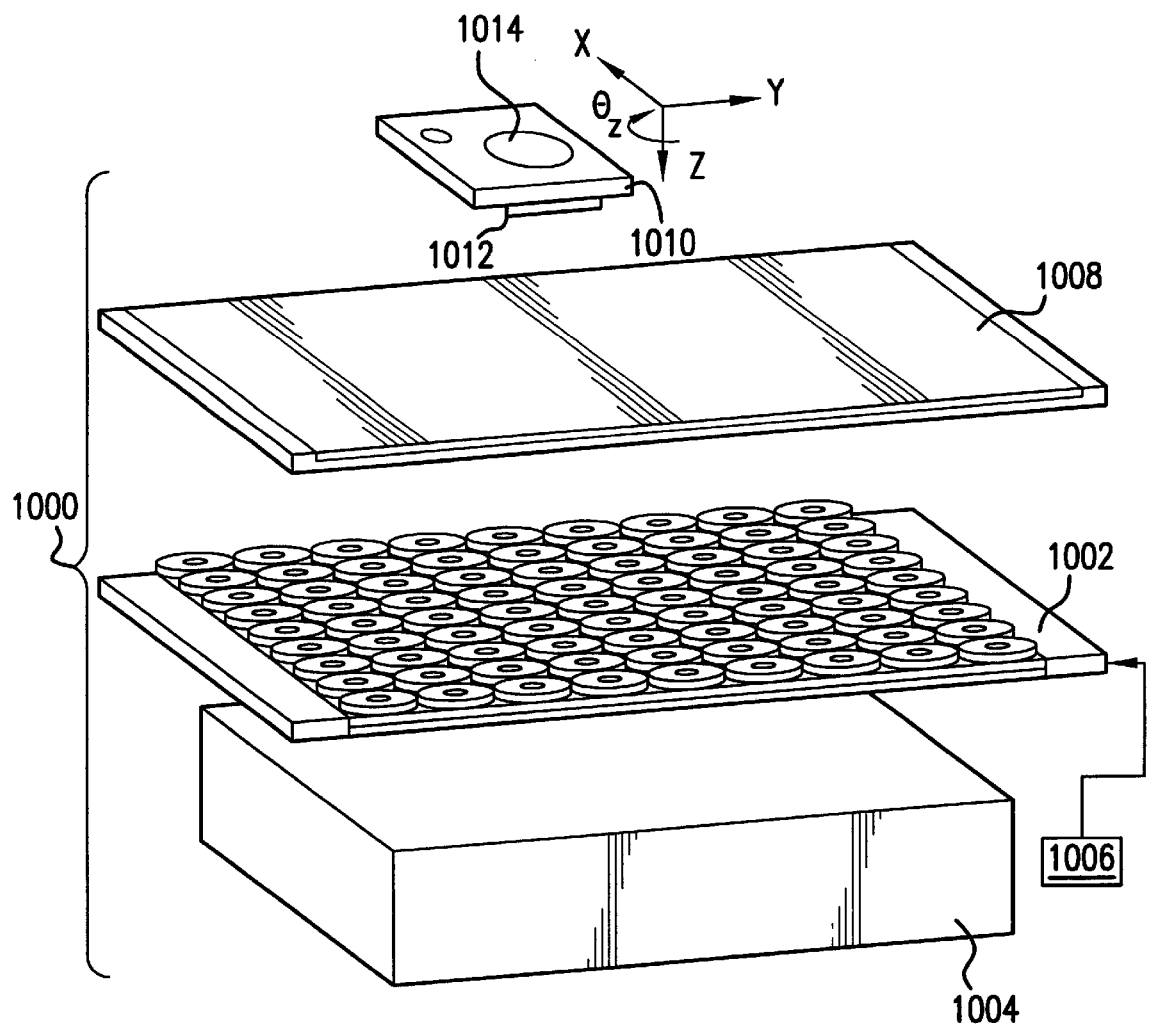
FIG. 10 is an exploded perspective view of an example of a photolithography system using the electric planar motor of the present invention.

FIG. 10 is an exploded perspective view of an example of a photolithography system using the electric planar motor of the present invention. FIG. 10 schematically illustrates the general components of a planar motor 1000 in which the magnet array moves relative to a stationary coil array. The planar motor 1000 comprises a coil array 1002 supported on a base 1004. The coil array 1002 is electrically energized under control of a controller 1006 to effect the operation of the planar motor. A top plate 1008 may be provided which is positioned above the coil array 1002. The top plate 1008 may be made of nonmagnetic materials, for example, carbon fiber, plastics, ceramics such as Zerodur ceramics, $Al_2O_3$ ceramics, and other materials which do not impair the magnetic flux of permanent magnets in the moving stage 1010. The moving stage 1010 rests on the top plate 1008, preferably in the presence of an air bearing. The underside of the moving stage 1010 has an array 1012 of permanent magnets, such as the magnet array 100 shown in FIGS. 1 and 2, configured to interact with the coil array 1002 to produce forces to move the moving stage 1010 across the top plate 1008. Such forces may be in, for example, the X, Y and $\theta_z$ directions shown.

For simplicity, many details of the planar motor are omitted from FIG. 10. Structural details and operational principles of planar motors are described, for example, in U.S. Pat. Nos. 4,535,278 and 4,555,650 to Asakawa, which are incorporated in their entireties by reference herein.

The moving stage 1010 may include a means 1014, such as a chuck, for supporting an article for precise positioning across a two-dimensional plane. For example, the moving stage 1010 may comprise a wafer stage having a wafer chuck for supporting a wafer for photolithography processing in the manufacturing of semiconductor devices. Examples of photolithographic systems that may incorporate a planar motor of the present invention are described in U.S. Pat. Nos. 5,773,837 to Nakasuji, 5,477,304 to Nishi, 5,715,037 to Saiki et al., 5,528,118 to Lee and 5,623,853 to Novak, which are fully incorporated in their entireties by reference herein.

Figure 11:
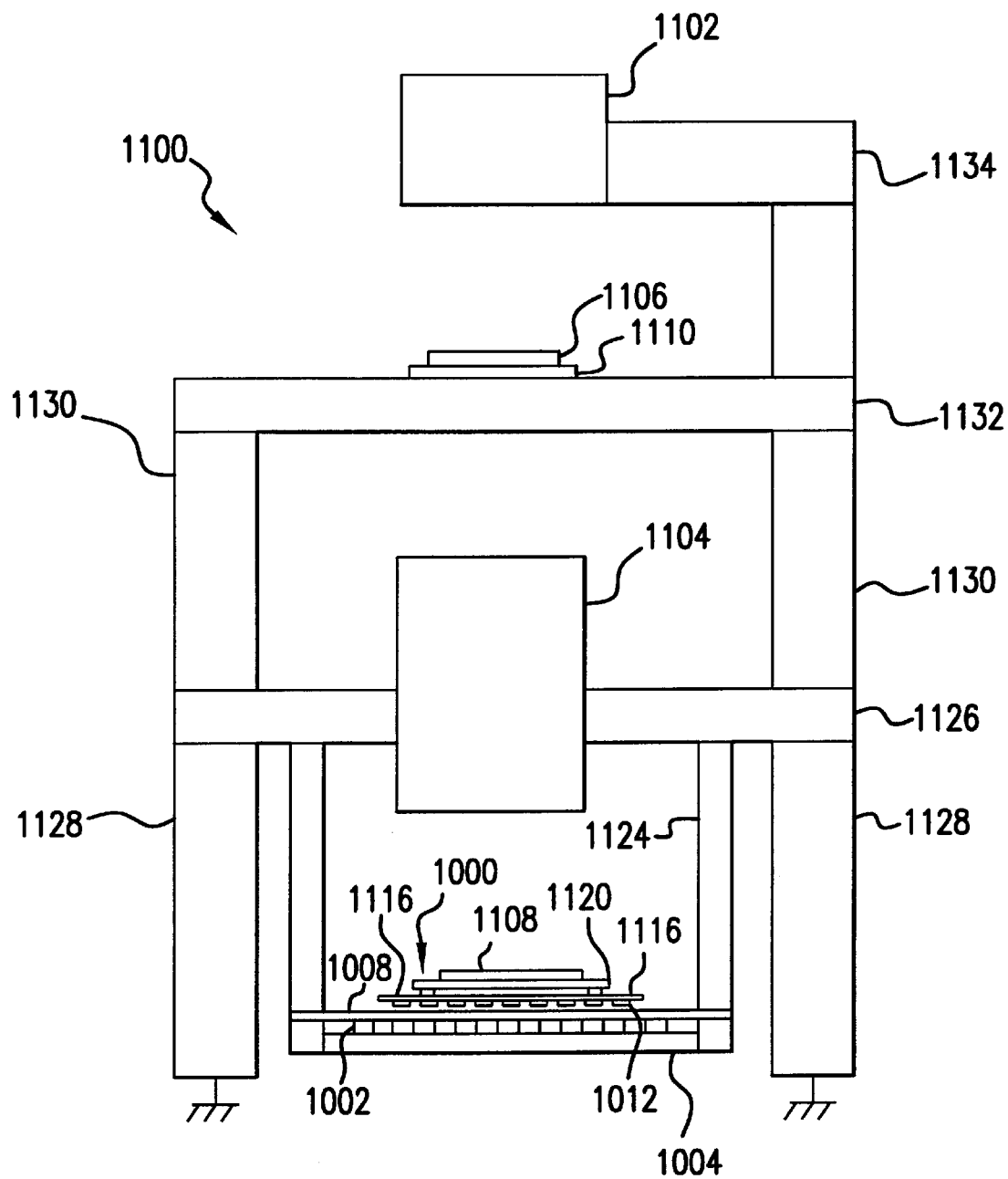
FIG. 11 is a schematic of an example of a photolithography system using the electric planar motor of the present invention.

FIG. 11 is a schematic of an example of a photolithography system 1100 using the electric planar motor 1000 of the present invention. The lithography system 1100 generally comprises an illumination system 1102 and a moving magnet planar motor 1000 for wafer support and positioning. The illumination system 1102 projects light through a mask pattern (e.g., a circuit pattern for a semiconductor device) on a reticle 1106 which is supported by and scanned using stage 1110. The reticle stage 1110 is supported by a frame 1132. The light is focused through a system of lenses 1104 supported on a frame 1126, which is in turn connected to the ground through a support 1128. The lens system 1104 is also connected to the illumination system 1102 through frames 1126, 1130, 1132, and 1134. The light exposes the mask pattern on a layer of photoresist on a wafer 1108.

The wafer 1108 is supported by and scanned using a wafer stage 1120 which is in turn supported and positioned by the planar motor 1000. The planar motor 1000 comprises the moving magnet array 1012 and a fixed coil array 1002. Although the photolithography system 1100 is described as utilizing a planar motor in which the permanent magnets are attached to the moving stage, the photolithography system may be adapted to utilize a moving coil planar motor or other variations of the moving magnet planar motor. The wafer stage 1120 and the moving magnet array 1012 are supported by an air bearing 1116 on the top plate 1008. The wafer stage system, including the base 1004, is connected to the frame 1126 through the frame 1124.

A similar planar motor may be used in the reticle stage 1110. Details of the implementation is not shown, but a person skilled in the art can implement the planar motor in the reticle stage 1110 without undue experimentation given the disclosure herein.

It is to be understood that the photolithography system may be different from the one shown herein without departing from the scope of the invention. It is also to be understood that the application of the planar motor of the present invention disclosed herein is not to be limited to wafer processing systems.

In particular, the photolithography system 1100 shown in FIG. 11 is described as a scanning photolithography system, wherein a pattern on a mask is exposed while the mask and a wafer are synchronously moved. Various embodiment(s) of the planar motor of the present invention may also be utilized in a step and repeat photolithography system, wherein a pattern on a mask is exposed while the mask and a wafer are stationary and the wafer is stepped in succession. The planar motor of the present invention may also be utilized in a proximity photolithography system, wherein a mask and a wafer are closely located and exposure of the mask pattern is accomplished without a projection system.

Furthermore, applications of the planar motor of the present invention or the photolithography system are not limited to a photolithography system for semiconductor manufacturing. The planar motor of the present invention may also be utilized, for example, in an LCD photolithography system for exposing LCD device pattern onto a rectangular glass plate and in a photolithography system for manufacturing a thin film magnetic head.

The light source for a photolithography system utilizing the planar motor of the present invention may be g-line (436 nm), i-line (365 nm), KrF excimer laser (248 nm), ArF excimer laser (193 nm), or F2 laser (157 nm) or may be charged particle beams such an X-ray and electron beams. In the case of an electron beam, thermionic emission type lantern hexaboride (LaB6) or tantalum can be used as an electron gun.

Reaction forces generated by motion of the wafer stage 1120 may be mechanically released to the floor or ground using a frame member as described in U.S. Pat. No. 5,528,118 (corresponding to published patent JP Hei 8-166475). In addition, reaction force generated by motion of the reticle stage 1100 also can be released to the floor or ground using a frame member as described in the published patent, JP Hei 8-330224 (U.S. Ser. No. 08/416,558).

As described above, the photolithography system according to the embodiment(s) of the present application can be built by assembling various subsystems, including the elements listed in the claims, in the manner that prescribed mechanical accuracy, electrical accuracy and optical accuracy are maintained.

Examples of the subsystems are the illumination system 1102, lens system 1104, reticle stage 1110 and wafer stage 1120.

In order to maintain the accuracy of the various subsystems, every optical system is adjusted to achieve its optical accuracy, every mechanical system is adjusted to achieve its mechanical accuracy, and every electrical system is adjusted to achieve its electrical accuracy before and its after assembly. The process of assembling each subsystem into a photolithography system includes mechanical interface, electrical circuits' wiring connections and air pressure plumbing connections. Each subsystem may be assembled prior to assembling the photolithography system from the subsystems. Once the photolithography system is assembled from the subsystems, total adjustment is performed so as to ensure that accuracy is maintained in the total system. It is desirable to manufacture a photolithography system in a clean room where temperature and cleanliness are controlled.

When the present invention is utilized to manufacture a semiconductor device, the semiconductor device may be fabricated through appropriate steps. One typical sequence of steps include, but is not limited to: designing the function and performance of the semiconductor device; designing a reticle according to the previous designing step; fabricating a wafer from a silicon material; exposing the reticle pattern over a wafer by an embodiment of the photolithography system of the present invention; assembling the semiconductor device (including dicing, bonding and packaging); and inspecting the semiconductor device.

Although only a few exemplary embodiments of this invention have been described in detail above, those skilled in the art will readily appreciate that many modifications are possible in the exemplary embodiments without materially departing from the novel teachings and advantages of this invention. Thus, all matter contained in the above description and shown in the accompanying drawings shall be interpreted as illustrative and not limiting.

What is claimed is:

1. A magnet array comprising:
   a plurality of first, second and third magnets disposed in a plane,
   each of said first magnets having a first polarity substantially perpendicular to the plane, each of said second magnets having a second polarity substantially opposite said first polarity, each of said third magnets having a third polarity substantially parallel to the plane.

2. A magnet array according to claim 1 wherein said first and second magnets are arranged in a checkerboard pattern in the plane and said third magnets are disposed between immediate adjacent first and second magnets.

3. A magnet array according to claim 2 wherein each third magnet and immediate adjacent first and second magnet form a continuous magnetic flux path therethrough.

4. A magnet array according to claim 2 wherein said first and second magnets are alternately arranged in a periodic manner along two orthogonal directions across the plane and said third magnets are disposed between one of said first magnets and one of said second magnets.

5. A magnet array according to claim 4 wherein the polarity alternates between immediate adjacent first and second magnets along two orthogonal directions across the plane.

6. A magnet array according to claim 4 wherein the polarity alternates between immediate adjacent first and second magnets along a diagonal of the array.

7. A magnet array according to claim 2, said array includes corner magnets disposed at corners of the array, non-corner edge magnets disposed along edges of the array and interior magnets disposed interior of said corner and edge magnets, said edge and interior magnets being selected from said first, second and third magnets, each edge magnet having a magnetic flux less than magnetic flux of a corresponding first, second or third interior magnet, said corner magnets being selected from first and second magnets and having a magnetic flux less than magnetic flux of a corresponding first, second or third interior magnet.

8. A magnet array according to claim 7, said corner and edge magnets being selected from one of said first and second magnets.

9. A magnet array according to claim 7, said corner magnets being selected from one of said first and second magnets, said edge magnets comprise a plurality of first, second and third magnets.

10. A magnet array according to claim 9, wherein said first and second edge magnets are alternately arranged in a periodic manner along the edges and corners of said array and said third edge magnets are disposed between immediate adjacent first and second edge magnets.

11. A magnet array according to claim 7, wherein each edge magnet has one-half the magnetic flux of the corresponding interior magnet and each corner magnet has one-quarter the magnetic flux of the corresponding interior magnet.

12. A magnet array according to claim 1, wherein each of said first and second interior magnets has approximately equal first interior magnetic flux and each of said third interior magnets has a magnetic flux less than or equal to the first interior magnetic flux.

13. A magnet array according to claim 12, wherein said magnetic flux of each of said third magnets is approximately one-half of the first interior magnetic flux.

14. A magnet array according to claim 12, wherein each interior first and second magnets comprises two or more component magnets having a resultant first polarity.

15. An electric motor comprising:
a magnet array comprising a plurality of first, second and third magnets disposed in a plane, said magnets having magnetic fields, each of said first magnets having a first polarity substantially perpendicular to the plane, each of said second magnets having a second polarity substantially opposite said first polarity, each of said third magnets having a third polarity substantially parallel to the plane;
a planar coil array positioned adjacent to the magnet array and operable to interact with the magnetic fields to provide a force between the coil array and the magnet array.

16. An electric motor according to claim 15, wherein said first and second magnets are arranged in a checkerboard pattern in the plane and said third magnets are disposed between immediate adjacent first and second magnets.

17. An electric motor according to claim 16 wherein each third magnet and immediate adjacent first and second magnet form a continuous magnetic flux path therethrough.

18. An electric motor according to claim 16 wherein said first and second magnets are alternately arranged in a periodic manner along two orthogonal directions across the plane and said third magnets are disposed between one of said first magnets and one of said second magnets.

19. An electric motor according to claim 18 wherein the polarity alternates between immediate adjacent first and second magnets along two orthogonal directions across the plane.

20. An electric motor according to claim 18 wherein the polarity alternates between immediate adjacent first and second magnets along a diagonal of the magnet array.

21. An electric motor according to claim 16, said magnet array includes corner magnets disposed at corners of the array, non-corner edge magnets disposed along edges of the magnet array and interior magnets disposed interior of said corner and edge magnets, said edge and interior magnets being selected from said first, second and third magnets, each edge magnet having a magnetic flux less than magnetic flux of a corresponding first, second or third interior magnet, said corner magnets being selected from first and second magnets and having a magnetic flux less than magnetic flux of a corresponding first, second or third interior magnet.

22. An electric motor according to claim 21, said corner and edge magnets being selected from one of said first and second magnets.

23. An electric motor according to claim 21, said corner magnets being selected from one of said first and second magnets, said edge magnets comprise a plurality of first, second and third magnets.

24. An electric motor according to claim 23, wherein said first and second edge magnets are alternately arranged in a periodic manner along the edges and corners of said magnet array and said third edge magnets are disposed between immediate adjacent first and second edge magnets.

25. An electric motor according to claim 21, wherein each edge magnet has one-half the magnetic flux of the corresponding interior magnet and each corner magnet has one-quarter the magnetic flux of the corresponding interior magnet.

26. An electric motor according to claim 25, wherein each of said first and second interior magnets has approximately equal first interior magnetic flux and each of said third interior magnets has a third magnetic flux less than or equal to the first interior magnetic flux.

27. An electric motor according to claim 26, wherein said third magnetic flux of each of said third magnets is approximately one-half of the first interior magnetic flux.

28. An electric motor according to claim 26, wherein each interior first and second magnets comprises two or more component magnets having a resultant first polarity.

29. An exposure apparatus comprising:
an optical system for imaging a pattern onto an article, the optical system comprising a frame;
a stage device for positioning of the article relative to the optical system for imaging, comprising:
a stage movable relative to the optical system and having a first surface and a second surface, the second surface being adapted for supporting the article;
a magnet array comprising a plurality of first, second and third magnets disposed in a plane, said magnets having magnetic fields, each of said first magnets having a first polarity substantially perpendicular to the plane, each of said second magnets having a second polarity substantially opposite said first polarity, each of said third magnets having a third polarity substantially parallel to the plane;
a planar coil array positioned adjacent to the magnet array and operable to interact with the magnetic fields to provide a force between the coil array and the magnet array in a first, second and third direction, the first and second directions being generally parallel to the plane and the third direction being generally orthogonal to the plane, one of the magnet array and the coil array being attached to the frame and the other of the magnet array and the coil array being attached to the first surface of the stage.

30. An exposure apparatus according to claim 29 wherein said first and second magnets are arranged in a checkerboard pattern the plane and said third magnets are disposed between immediate adjacent first and second magnets.

31. An exposure apparatus according to claim 30 wherein each third magnet and immediate adjacent first and second magnet form a continuous magnetic flux path therethrough.

32. An exposure apparatus according to claim 30 wherein said first and second magnets are alternately arranged in a periodic manner along two orthogonal directions across the plane and said third magnets are disposed between one of said first magnets and one of said second magnets.

33. An exposure apparatus according to claim 32 wherein the polarity alternates between immediate adjacent first and second magnets along two orthogonal directions across the plane.

34. An exposure apparatus according to claim 32 wherein the polarity alternates between immediate adjacent first and second magnets along a diagonal of the magnet array.

35. An exposure apparatus according to claim 30, wherein said magnet array includes corner magnets disposed at corners of the array, non-corner edge magnets disposed along edges of the magnet array and interior magnets disposed interior of said corner and edge magnets, said edge and interior magnets being selected from said first, second and third magnets, each edge magnet having a magnetic flux less than magnetic flux of a corresponding first, second or third interior magnet, said corner magnets being selected from first and second magnets and having a magnetic flux less than magnetic flux of a corresponding first, second or third interior magnet.

36. An exposure apparatus according to claim 35, said corner and edge magnets being selected from one of said first and second magnets.

37. An exposure apparatus according to claim 35, said corner magnets being selected from one of said first and second magnets, said edge magnets comprise a plurality of first, second and third magnets.

38. An exposure apparatus according to claim 37, wherein said first and second edge magnets are alternately arranged in a periodic manner along the edges and corners of said magnet array and said third edge magnets are disposed between immediate adjacent first and second edge magnets.

39. An exposure apparatus according to claim 35, wherein each edge magnet has one-half the magnetic flux of the corresponding interior magnet and each corner magnet has one-quarter the magnetic flux of the corresponding interior magnet.

40. An exposure apparatus according to claim 39, wherein each of said first and second interior magnets has approximately equal first interior magnetic flux and each of said third interior magnets has a third magnetic flux less than or equal to the first interior magnetic flux.

41. An exposure apparatus according to claim 40, wherein said third magnetic flux of each of said third magnets is approximately one-half of the first interior magnetic flux.

42. An exposure apparatus according to claim 40, wherein each interior first and second magnets comprises two or more component magnets having a resultant first polarity.

* * * * *